US011630493B2

(12) United States Patent
Kruse

(10) Patent No.: US 11,630,493 B2
(45) Date of Patent: *Apr. 18, 2023

(54) VENTILATION DEVICE

(71) Applicant: Unify GmbH & Co. KG, Munich (DE)

(72) Inventor: Thomas Kruse, Witten (DE)

(73) Assignee: Unify GmbH & Co. KG, Munich (DE)

( * ) Notice: Subject to any disclaimer, the term of this patent is extended or adjusted under 35 U.S.C. 154(b) by 288 days.

This patent is subject to a terminal disclaimer.

(21) Appl. No.: 17/083,088

(22) Filed: Oct. 28, 2020

(65) Prior Publication Data

US 2021/0041925 A1 Feb. 11, 2021

Related U.S. Application Data

(63) Continuation of application No. 16/001,337, filed on Jun. 6, 2018, now Pat. No. 10,860,069, which is a continuation of application No. 15/111,558, filed as application No. PCT/EP2015/000202 on Feb. 2, 2015, now Pat. No. 10,019,045.

(30) Foreign Application Priority Data

Feb. 3, 2014 (DE) .......................... 102014001423.1

(51) Int. Cl.
  *G06F 1/20* (2006.01)
  *H05K 7/20* (2006.01)
(52) U.S. Cl.
  CPC ............ *G06F 1/20* (2013.01); *H05K 7/20145* (2013.01)
(58) Field of Classification Search
  CPC ............................... G01F 1/20; H05K 7/20145
  See application file for complete search history.

(56) References Cited

U.S. PATENT DOCUMENTS 5,694,294 A 12/1997 Ohashi et al.
6,108,203 A 8/2000 Dittus et al.
(Continued)

FOREIGN PATENT DOCUMENTS

| CN | 102480901 A | 5/2012 |
| DE | 20209392 U1 | 9/2002 |
| JP | 2001111275 A | 4/2001 |

OTHER PUBLICATIONS

Written Opinion of the International Searching Authority for PCT/EP2015/000202 dated Apr. 16, 2015 (Form PCT/ISA/237). (German Translation).

(Continued)

*Primary Examiner* — Steven S Anderson, II
(74) *Attorney, Agent, or Firm* — Buchanan Ingersoll & Rooney PC

(57) ABSTRACT

A ventilation device (1) is proposed, in particular designed to ventilate a circuit board (2), preferably in or for a computer, wherein the ventilation device (1) is designed to produce a first cooling air stream (5) from a first fan (12) and to produce a second cooling air stream (7) from a second fan (13), wherein the first cooling air stream (5) and the second cooling air stream (7) flow through on different sides of an air stream boundary plane (L), preferably parallel to the air stream boundary plane (L), through a common ventilation plane (BL) perpendicular to the air stream boundary plane (L), wherein the directions of flow from the first fan (12) and the second fan (13) are crosswise to the air stream boundary plane (L), wherein the ventilation device (1) preferably is designed to be mountable such that the air stream boundary plane (L) coincides with a central plane of the circuit board.

20 Claims, 8 Drawing Sheets

(56) References Cited

U.S. PATENT DOCUMENTS

| | | | |
|---|---|---|---|
| 6,252,770 B1 | 6/2001 | Yu et al. | |
| 6,266,243 B1 | 7/2001 | Tomioka | |
| 6,587,340 B2 | 7/2003 | Grouell et al. | |
| 6,594,148 B1 | 7/2003 | Nguyen et al. | |
| 6,924,978 B2 | 8/2005 | DiStefano | |
| 10,019,045 B2 * | 7/2018 | Kruse | H05K 7/20145 |
| 10,860,069 B2 * | 12/2020 | Kruse | G06F 1/20 |
| 2005/0199369 A1 | 9/2005 | Chen | |
| 2006/0146494 A1 | 7/2006 | Chiu et al. | |
| 2006/0181846 A1 | 8/2006 | Farnsworth et al. | |
| 2007/0072443 A1 * | 3/2007 | Rohrbach | G06F 1/1633 |
| | | | 439/39 |
| 2008/0180910 A1 * | 7/2008 | Tomioka | G06F 1/203 |
| | | | 361/695 |
| 2011/0079374 A1 | 4/2011 | Horng et al. | |
| 2011/0241506 A1 | 10/2011 | Tang et al. | |
| 2014/0029194 A1 | 1/2014 | Hayashi | |
| 2014/0098493 A1 * | 4/2014 | Chen | H05K 7/20145 |
| | | | 165/104.34 |
| 2014/0133086 A1 | 5/2014 | Chen et al. | |

OTHER PUBLICATIONS

International Search Report for PCT/EP2015/000202 dated Apr. 16, 2015 (Form PCT/ISA/210). (German Translation).

* cited by examiner

VENTILATION DEVICE

CROSS REFERENCE TO RELATED APPLICATIONS

This application is a continuation of U.S. patent application Ser. No. 16/001,337, which is a continuation of U.S. patent applicaiton Ser. No. 15/111,558, which is the United States National Stage under 35 U.S.C. § 371 of PCT International Application No. PCT/EP2015/000202, filed on Feb. 2, 2015 and claiming priority to German Patent Application No. 10 2014 001 423.1, filed on Feb. 3, 2014.

BACKGROUND OF THE INVENTION

Field of the Invention

The invention concerns a ventilation device. In particular, the invention concerns a ventilation device for ventilating a circuit board, preferably in a computer.

Background of the Related Art

Various arrangements for ventilating a circuit board or the components of a circuit board are known. Examples of such arrangements according to the prior art are shown in FIGS. 8A and 8B. FIG. 8A shows a circuit board 100 with a component 101. The component 101 in this example is a central processing unit (CPU). It is known to cool the component 101 using an installed fan 102 that pulls a stream of air 103 from above and blows it directly downward onto the component 101. After flowing over the component 101, the stream of air 103 is deflected by the circuit board 100 and passes over the circuit board 100. FIG. 8B shows another circuit board 100 with components 101 on both sides of it. A fan 102 is placed to the side of the circuit board and directs a stream of air 103 onto one side edge of the circuit board 100, where the stream of air is split and flows along the top and bottom sides of the circuit board 100 to cool the components 101.

The available space inside a computer housing can be limited. It is common, in particular, to have multiple cards inserted into connector strips ("slots"), sometimes with predetermined small distances between them. However, ventilation devices of the type described have a comparatively large height in relation to the thickness of the installed circuit board or are added above the components installed on the circuit board, which often makes the use of these types of ventilation problematic. For example, in the applicant's series X3/X5 OSBiz wall systems, especially when using a UC booster card, due to the greater component thickness and installation on both sides and in connection with a temperature-sensitive hard drive, forced ventilation in the housing is desirable, because the natural convection inside the housing is stretched to its limits. Changing the housing, the motherboard, or the installation positions is difficult to do. Especially critical here is the hard drive, which may have a temperature limit that should not be exceeded, such as 55° C., that varies depending on the manufacturer.

BRIEF SUMMARY OF THE INVENTION

One goal of the present invention is to offer a circuit board ventilation device that at least partially eliminates the disadvantages of the prior art. A specific goal of the invention is to offer a circuit board ventilation device that allows two-sided ventilation of a circuit board with the smallest possible device height.

Embodiments are based on the concept of placing two fans next to a circuit board, as an extension of the circuit board's plane, wherein the fan axes are at an angle, in particular perpendicular, to the circuit board's plane, and wherein the air currents from the fan flow over the circuit board's plane and are directed by appropriate air guide elements such that a stream of air flows largely tangentially over each side of the circuit board.

Figure 1:
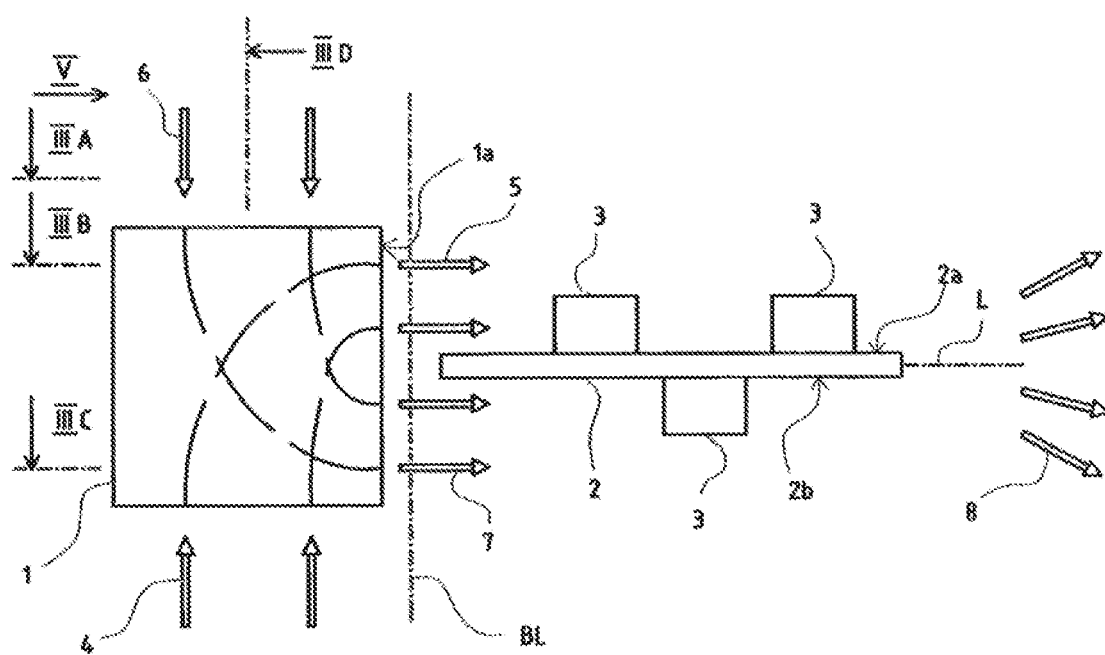
FIG. 1 a representation of a ventilation device according to a first embodiment of the present invention in a first configuration.

The figures are schematic illustrations and not necessarily according to scale. The graphic representations and their descriptions are intended to illustrate the principle of the invention and shall in no way restrict the invention.

DETAILED DESCRIPTION OF THE INVENTION

As discussed above in the Brief Summary of the Invention, embodiments are based on the concept of placing two fans next to a circuit board, as an extension of the circuit board's plane, wherein the fan axes are at an angle, in particular perpendicular, to the circuit board's plane, and wherein the air currents from the fan flow over the circuit board's plane and are directed by appropriate air guide elements such that a stream of air flows largely tangentially over each side of the circuit board.

In this regard, one aspect of the invention proposes a ventilation device designed to produce a first cooling air stream from a first fan and to produce a second cooling air stream from a second fan, wherein the first cooling air stream and the second cooling air stream flow through on different sides of an air stream boundary plane, preferably parallel to the air stream boundary plane, through a common ventilation plane perpendicular to the air stream boundary plane, wherein the directions of flow from the first fan and the second fan are crosswise to the air stream boundary plane. The ventilation device is intended in particular for ventilating a circuit board, preferably in or for a computer, and is designed preferably to be installed in such a way that the air stream boundary plane coincides with a central plane of the circuit board.

A ventilation plane for purposes of the invention is a plane facing an object to be ventilated and through which the cooling air streams travel in order to ventilate the object. An air stream boundary plane for purposes of the invention is a plane that can be established as a boundary between the two cooling air flows at any time after they leave the ventilation device. This means that each component immediately adjacent to the ventilation device and located in the air stream boundary plane has a tangential flow of cooling air streams over it on one side of the air stream boundary plane.

It should be understood that the cooling air streams can be mixed at a certain distance from the ventilation device, if the separation of the cooling air streams is not maintained by an object located in the air stream boundary plane. Crosswise to the air stream boundary plane for purposes of the invention means not parallel, so at an angle or, preferably, perpendicular or essentially perpendicular to the air stream boundary plane. In other words, the first and second cooling air streams are deflected by the ventilation device from the crosswise direction to 90°±x (depending on the angular placement of the fan), so that they flow parallel or essentially parallel to each other along the air stream boundary plane that coincides with a circuit board plane, for example, when the invention is used.

Because fans generally have a flat design, i.e., are thinner in the flow direction than across it, the diagonal or in particular 90°-angled arrangement with its subsequent flow deflection makes it possible for the fan to be installed flat with respect to the ventilation direction. This can also reduce the unit height. Two sides of an object, in particular a circuit board, can be ventilated purposefully, and the air streams are directed so that the first cooling air stream flows along a first circuit board flat side of the circuit board and the second cooling air stream flows along a second circuit board flat side of the circuit board. Air, for purposes of the invention, is any cooling gas mix, in particular ambient air. A circuit board for purposes of the invention is, in general, a flat unit with two flat sides (circuit board flat sides or populated sides) and generally four edge sides. Conceivably, circuit boards can also have one (e.g., round, oval, or similar), two (e.g., spear-shaped), three, or five or more edge sides. Both circuit board flat sides can be populated, and the invention can also be used if only one side is populated but heat is also conducted to the other side. It is also possible for a heat-generating component to be installed on one portion of the circuit board and generate heat to both surface sides. The ventilation plane can coincide with the circuit board.

According to one preferred embodiment of the ventilation device, the first cooling air stream and the second cooling air stream are discharge streams or suction streams from the first fan or the second fan. In other words, the air streams travel in the same preferred direction through the ventilation plane. A suction stream is an air stream drawn toward a fan, and a discharge stream is an air stream pushed away from a fan. Because the first and second cooling air streams flow in essentially the same direction with respect to a main flow direction parallel to the air stream boundary plane, a relatively large volume of air can also be forced along the length of the object to be ventilated, whereby an at least essentially uniform temperature profile can also be achieved on the front and back sides of the object. The main flow direction is understood to be an axis that runs perpendicular to the ventilation plane within the air stream boundary plane. The cooling air streams can have lateral angular deviations from the main flow direction and also extend in a fan shape.

According to one alternative preferred embodiment of the ventilation device, the first cooling air stream is a discharge stream from the first fan or from the second fan, and the second cooling air stream is a suction stream from the other of the first and second fans. In other words, the air streams travel in opposite preferred directions through the ventilation plane. This means that the first and second cooling air streams flow at least essentially in opposite directions with respect to a main flow direction parallel to the air stream boundary plane. This results in a push-pull arrangement. Thus, for example, if the air streams cannot escape at the downstream side of the ventilated object, it is possible to achieve an air flow around the object such that the first cooling air stream (discharge stream) flowing along a first side of the object is deflected at the end and flows along the second side of the object as a second cooling air stream drawn through the second fan (suction stream).

According to one preferred embodiment, the ventilation device has a housing with a ventilation side that defines a or the ventilation plane and on which the housing is at least partially open, and a mounting plate that splits the ventilation side and defines a or the air stream boundary plane, wherein the mounting plate has at least two fans or is configured to accept at least two fans of such a type that a cooling air stream from each fan is or can be directed through a respective opening in the mounting plate, wherein each fan has an assigned air guidance chamber that is open toward the ventilation side and is closed or essentially closed on all other sides except for the respective opening in the mounting plate. The problem addressed by the present invention is solved by this device for the same reasons as the ones stated above for the aforementioned ventilation device. An air guidance chamber for the purposes of the invention is understood to be a chamber that is part of the housing and deflects air streams forced by the fans such that their flow paths run through the ventilation plane. This allows the air stream flows according to the invention to be advantageously generated.

According to one preferred embodiment of the ventilation device, the fans are placed on different sides of the mounting plate. In other words, the ventilation device or the mounting plate is configured in such a way that the fans are or can be placed on different sides of the mounting plate, or are or can be placed essentially on different sides of the mounting plate. Preferably, the fans are placed on the sides of the mounting plate opposite from the respective air guidance chamber, so that they do not impede the air flow in the air guidance chamber. However, it is also possible and included in the invention for one or more fans to project partially through the opening in the separation plate, which can further reduce the installed height of the ventilation device.

According to another preferred embodiment of the ventilation device, each air guidance chamber for one of the fans is separated on its side of the mounting plate from the area of another one of the fans, wherein each of them in particular has a separation wall that extends preferably perpendicular to the mounting plate and especially preferably at an angle to the ventilation side. In other words, one of the air guidance chambers for one of the fans is installed on one side of the mounting plate, for example using suitable crosspieces, cover plates, etc., and is separated from the area of the respective other fan by the separation wall. In this configuration, angular placement of the separation walls is chosen in particular, so that the air guidance chambers widen toward the ventilation side of the ventilation device. This makes it possible to achieve a fan-shaped stream flow of the cooling air stream that spreads out parallel to the air stream boundary plane. If the fans are placed next to each other relative to the narrow side of the circuit board, then the total width of the circuit board can at least essentially be covered by the cooling air stream. In one variation of the invention, if the fans are not placed next to each other but rather one in front of the other, which can be desirable with very narrow circuit boards, with a suitably shaped separation wall the adjacent chamber of the fan nearer to the ventilation side can be housed inside the air guidance chamber of the farther fan, so that the adjacent chamber of the fan nearer to the ventilation side is enveloped by the cooling air flow from the farther fan. In this way, the separation walls can be used to achieve effective separation and also suitable guidance of the air streams.

According to one preferred embodiment of the ventilation device, the mounting plate is a section of a circuit board, in particular the circuit board to be ventilated. In other words, the circuit board has an area in which the openings for the fans are placed, the fans are or can be installed directly on the circuit board, and a housing or housing sections that create the chambers for deflecting the air stream are or can be placed on the circuit board. In addition, fewer components are needed with this embodiment, and the circuit board can be preconfigured for ventilation. The housing, or portions or halves of it, and fans can be provided as an assembly. Assembly is easier and more secure, and it is no longer necessary to align the ventilation device with the circuit board.

Preferred embodiments of the ventilation device are characterized in that the housing contains or is made from or is essentially made from at least one of the following materials:

- plastic, in particular ABS (acrylonitrile-butadiene styrene), PC (polycarbonate), or a mix thereof,
- circuit board material,
- metal, in particular aluminum or steel plate,
- cardboard, paper, pasteboard, or similar.

According to one preferred embodiment of the ventilation device, a symmetrical connection port is provided for the electric power supply to the fans, wherein the connection port preferably has a suitable negative pole for grounding and respective positive poles for supplying power to each of the fans arranged symmetrically around the negative pole. Symmetrical in this context should be understood specifically to mean electrically symmetrical. This allows for increased installation safety by preventing voltage reversal.

Connection and voltage reversal safety can be improved even more in a preferred embodiment of the ventilation device, if the symmetrical connection port has a form characteristic that unmistakably establishes a connection point. Such a form characteristic can include, without limitation, a bevel, groove, or spline, a pin or recess, a tab, etc. The form characteristic can also be a different distance between the positive poles and the negative pole or an angled placement of the poles. A plug belonging to a connection lead can then have the corresponding complementary form characteristic.

The objective of the invention is also achieved by means of a method for ventilating in particular a circuit board, preferably in or for a computer, with the following steps: Generate a first cooling air stream from a first fan and a second cooling air stream from a second fan, wherein the first cooling air stream and the second cooling air stream flow through on different sides of an air stream boundary plane, preferably parallel to the air stream boundary plane, through a common ventilation plane perpendicular to the air stream boundary plane, the directions of flow from the first fan and the second fan are crosswise to the air stream boundary plane, and ventilation is established in such a way that the air stream boundary plane coincides with a center plane of the circuit board. The problem addressed by the present invention is solved by this method for the same reasons as the ones stated above for the aforementioned ventilation device.

Additional features, tasks, advantages and details of the present invention will become more apparent from the following description of concrete exemplary embodiments and their representation in drawings in the included figures. It is understood that features, tasks, advantages and details of individual exemplary embodiments are transferrable to other exemplary embodiments and are considered to be disclosed also in connection with the other exemplary embodiments unless this is obviously inapplicable for technical or physical reasons. Exemplary embodiments can be combined with other exemplary embodiments and that combination can also be considered an exemplary embodiment of the invention.

The invention is described below in more detail based on preferred exemplary embodiments and with reference to the figures.

Figure 2:
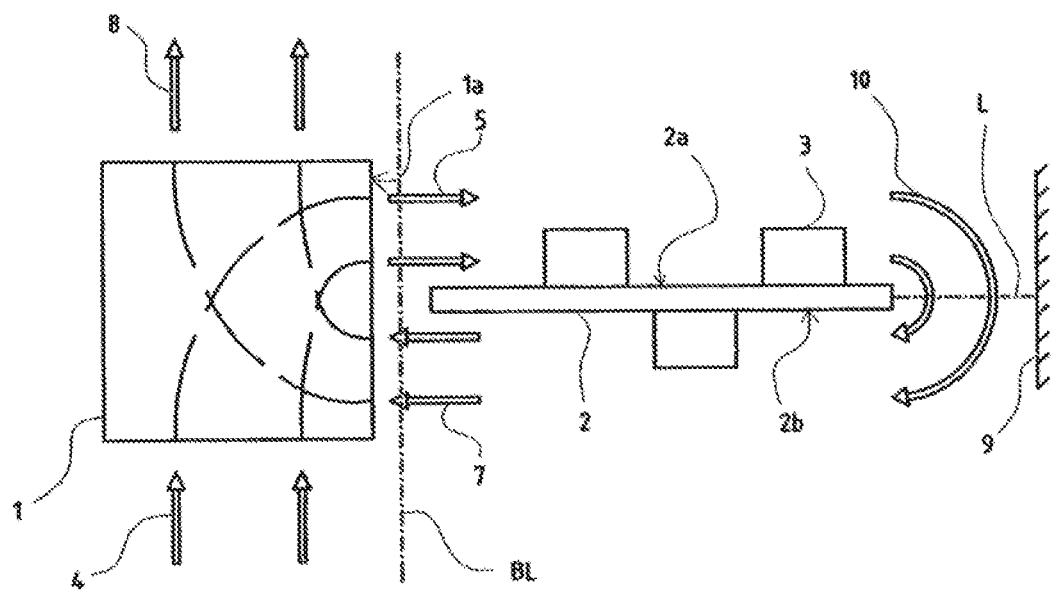
FIG. 2 a representation of the ventilation device according to the first embodiment in a second configuration.

A basic function process of a ventilation device 1 according to a first basic embodiment is explained here according to FIGS. 1 and 2. FIGS. 1 and 2 are side views of the ventilation device 1, which is placed in appropriate operating position next to a circuit board 2. Air streams are represented in the figure with bold arrows or, if covered by components, with broken lines.

According to the representations in FIGS. 1 and 2, the circuit board 2 is populated with components 3 on a top side 2a and a bottom side 2b and has a center plane or circuit board plane L that runs through the middle between the top side 2a and the bottom side 2b of the circuit board 2. The ventilation device 1 has a ventilation side 1a facing the circuit board 2. The ventilation side 1a defines a ventilation plane BL that is perpendicular to the circuit board plane L and through which pass cooling air streams used by the ventilation device 1 to cool or ventilate the circuit board 2. The ventilation device 1 has two fans located inside of the ventilation device 1 (not visible here). The ventilation device 1 can be operated in two basic configurations which will now be explained in detail.

FIG. 1 shows a first configuration of the ventilation device 1. In it, a fresh air stream 4 is drawn through an opening (not shown here) in the underside of the ventilation device 1, deflected inside of the ventilation device 1 by appropriate air guidance elements, and pushed out above the circuit board plane L as a first cooling air stream 5 through an opening (not shown here) in the ventilation side 1a of the ventilation device 1 in such a way that it leaves the ventilation device 1 by passing through the ventilation plane BL, parallel to the circuit board plane L on the top side 2a of the circuit board 2. Similarly, a second fresh air stream 6 is drawn through an opening (not shown here) in the top side of the ventilation device 1, deflected inside of the ventilation device 1 by appropriate air guidance elements, and pushed out under the circuit board plane L as a second cooling air stream 7 to ventilate the underside 2b of the circuit board 2 through an opening (not shown here) in the ventilation side 1a of the ventilation device 1 in such a way that it leaves the ventilation device 1 by passing through the ventilation plane BL, parallel to the circuit board plane L on the underside 2b of the circuit board 2. The circuit board plane L can thus also be called the air stream boundary plane L, which establishes a boundary between the first cooling air stream 5 and the second cooling air stream 7. After flowing over the circuit board 2, the first cooling air stream 5 and the second cooling air stream 7 combine into an exhaust stream 8, which can leave a computer housing (not shown here) through ventilation slots (not shown here), for example. It should be noted that the air stream boundary plane L can then also be established by the originally separated cooling air streams 5, 7, if the circuit board 2 is not available; in that case, of course, the cooling air streams 5, 7 would then combine sooner. The first operating mode can also be called push ventilation (ventilation blown outward). The direction of the fresh air streams 4, 6 is preferably selected such that a thermal updraft in the enclosed space (such as a computer housing) is supported or utilized.

In one variation of the first operating mode, the two fans can work in the opposite direction, so that air streams from the top side 2a and underside 2b of the circuit board 2 are drawn through the ventilation plane BL and discharged onto the top and bottom sides of the ventilation device 1 as exhaust streams. This operating mode variation can also be called pull ventilation (ventilation drawn in). It can be understood by reversing all air stream arrow directions in FIG. 1.

FIG. 2 shows a second operating mode of the ventilation device 1. Here it is assumed that behind the circuit board 2, i.e. on one of the narrow sides of the circuit board 2 opposite the ventilation device 1, there is a housing wall 9 of a computer or another impediment that would hinder the free flow of an exhaust stream. In the second operating mode, a first fan operates as in the first operating mode in push mode, i.e., a fresh air stream 4 is drawn in through the opening in the underside of the ventilation device 1, deflected, and discharged above the circuit board plane L as a first cooling air stream 5 parallel to the top side 2a of the circuit board 2. Unlike the first operating mode, in the second operating mode a second fan operates in pull mode, i.e., a second cooling air stream 7 that flows along the underside 2b of the circuit board 2 is drawn through the ventilation plane BL into the ventilation device 1, deflected there, and discharged through the opening in the top side of the ventilation device 1 as the exhaust stream 8. The second cooling air stream 7, which ventilates the underside 2b of the circuit board 2, originates at least in part from the first cooling air stream 5 that is reversed at the wall 9 into a reverse stream 10. The second air stream 7 is drawn in and reversed by the same fan and the same air guidance elements that draw in and reverse the second fresh air stream 6 in the first operating mode (FIG. 1), except that the fans used here operate in the other direction. The reversal of the first cooling air stream 5 to become the reverse stream 10 is accomplished by the suction action of the fan operating in pull mode. The second operating mode can also be called push-pull ventilation. It should be understood that in this operating mode the working directions of the fans can also be reversed, so that all flow directions are reversed.

In both operating modes, the first and second cooling air streams 5, 7 are generated by respective fans in the ventilation device 1. If appropriate, the fans can be different sizes, and it can in particular be useful for a fan that works against the thermal updraft in the surrounding space to be more powerful. In all cases, the air stream flow should be such that the intermixing of fresh air and exhaust air is prevented or essentially prevented.

Figure 3A:
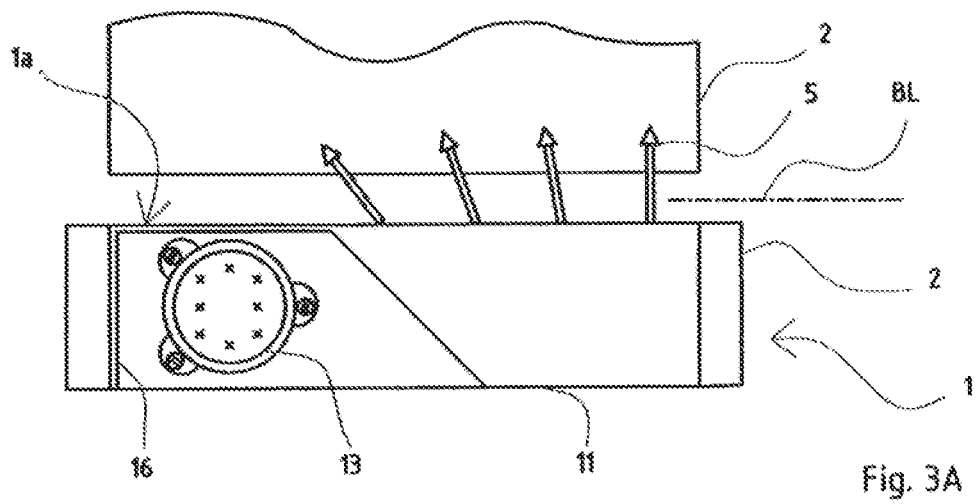
FIGS. 3A to 3F several enlarged views and sections of the ventilation device according to the first embodiment in the first operating mode.
Figure 3B:
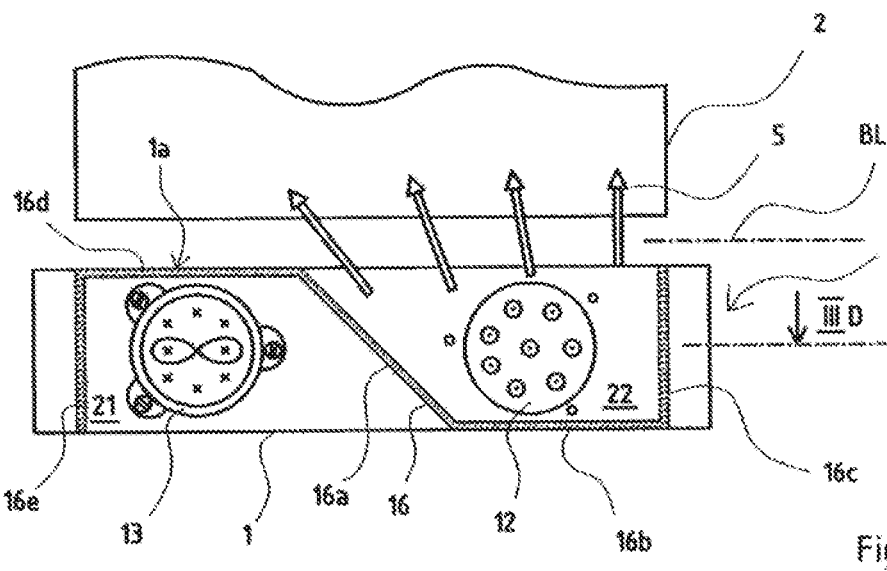
Figure 3C:
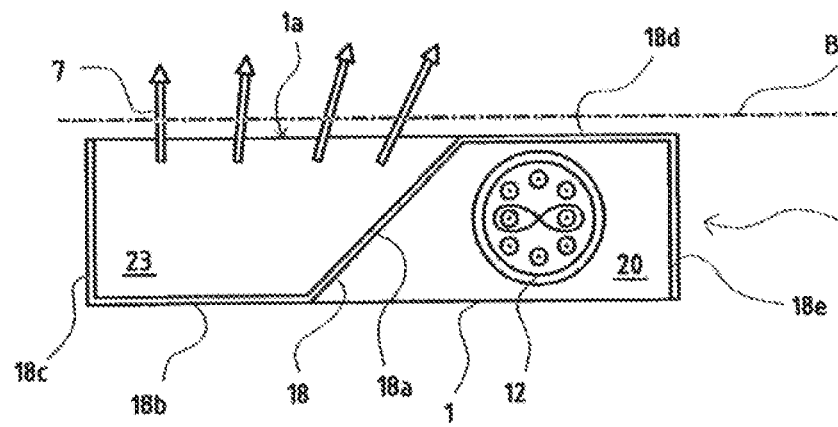
Figure 3D:
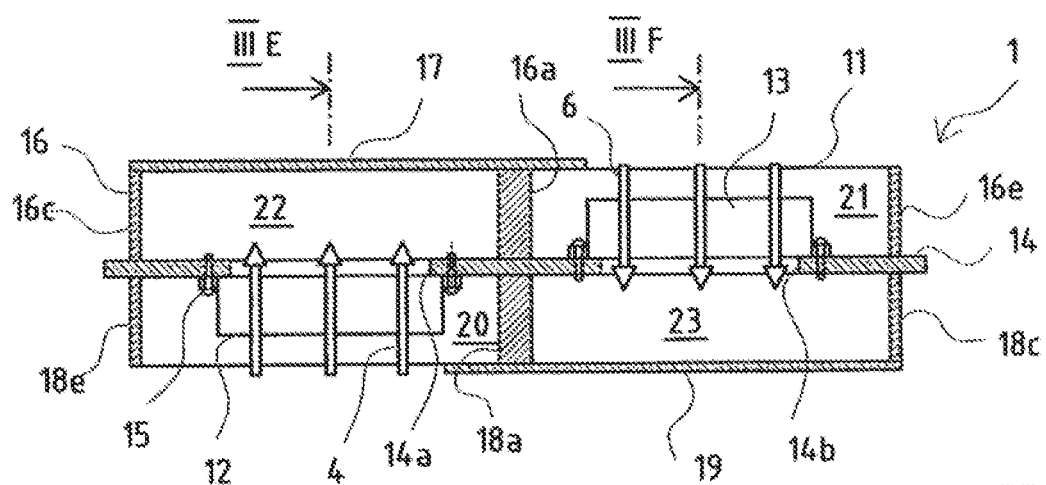
Figure 3E:
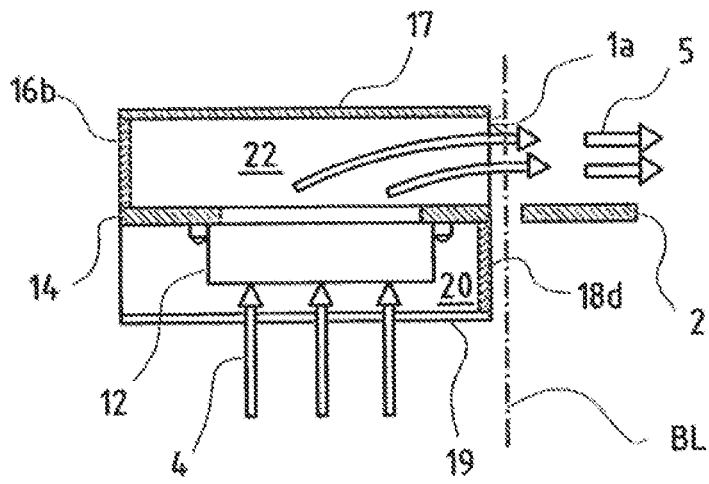
Figure 3F:
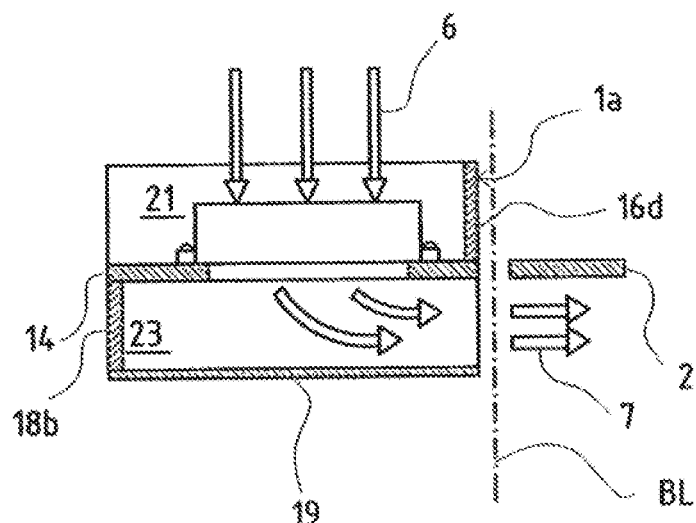

An interior arrangement of the ventilation device 1 will now be described in greater detail based on FIGS. 3A to 3F. In this regard, FIG. 3A shows a top view in a plane and a direction indicated in FIG. 1 by a dot-dash line and an arrow IIIA, FIG. 3B shows a cutaway view from above in a plane and a direction indicated in FIG. 1 by a dot-dash line and an arrow IIIB, i.e., above the air stream boundary plane L, FIG. 3C shows a cutaway view from above in a plane and a direction indicated in FIG. 1 by a dot-dash line and an arrow IIIC, i.e., under the air stream boundary plane L, FIG. 3D shows a cross-section view from the direction of the circuit board 2 in a plane and a direction indicated in FIG. 1 and FIG. 3B by a dot-dash line and an arrow IIID, FIG. 3E shows a cutaway view from the side in a plane and a direction indicated in FIG. 3D by a dot-dash line and an arrow IIIE, and FIG. 3F shows a cutaway view from the side in a plane and a direction indicated in FIG. 3D by a dot-dash line and an arrow IIIF. The ventilation device 1 is shown in all FIGS. 3A-3F in the first configuration according to FIG. 1.

FIG. 3A shows the ventilation device 1 from above with a section of the circuit board 2. As shown in FIG. 3A, the first cooling air stream 5 leaves the ventilation device 1 on the ventilation side 1a in a fan-shaped flow such that the cooling air stream 5 fans out from the right side toward the middle. The cooling air stream flowing under the circuit board 2 (7, FIG. 1) is not shown in FIG. 3A, but it flows as can clearly be seen in other figures, also fan-shaped with an opposing fan-out direction. The ventilation side 1a is designated hereinafter as the front, and the opposite side as the back.

As can best be seen in FIG. 3D, which shows a cross-section approximately in the middle and parallel to the ventilation plane (FIG. 1), the ventilation device 1 has a housing 11, a first fan 12, and a second fan 13. The housing 11 has a mounting plate 14, which forms the air stream boundary plane (L, FIG. 1), and a first opening 14a and a second opening 14b. The first fan 12 is secured with screws 15 to an underside of the mounting plate 14 in the area of the first opening 14a, and the second fan 13 is secured with screws 15 to a top side of the mounting plate 14 in the area of the second opening 14b. On the top side of the mounting plate 14 there is a first crosspiece 16 extending perpendicularly, which is partially covered on top by a first cover plate 17 that runs parallel to the mounting plate 14. Similarly, on the underside of the mounting plate 14 there is a second crosspiece 18 extending perpendicularly, which is partially covered on the bottom by a second cover plate 19 that runs parallel to the mounting plate 14.

The course of the first crosspiece 16 is best seen in FIG. 3B, which shows the ventilation device 1 in a horizontal section above the circuit board 2 (the air stream boundary plane L, FIG. 1). The first crosspiece 16 has a separation wall 16a that runs diagonally between the openings 14a, 14b over the cover plate 14 and thereby separates an area around the first opening 14a from an area around the second opening 14b above the cover plate 14. Hereinafter the area of the first opening 14a is also designated as the area of the first fan 12 and the area of the second opening 14b is also designated as the area of the second fan 13, wherein the areas around the fans 12, 13 are understood to extend in a perpendicular direction to the mounting plate 14 and to be bordered by the crosspieces 16, 18. In the area of the first fan 12 (the first opening 14a) a side wall 16c adjoins the separation wall 16a at a back edge of the cover plate 14, running along a back wall 16b and then bending toward the front at right angles as it continues. In the area of the second fan 13 (the second opening 14b) another side wall 16e adjoins the separation wall 16a at the front edge (ventilation side 1a, see FIG. 3A) of the cover plate 14, running along a front wall 16d and then bending toward the back at right angles as it continues. In other words, the first crosspiece 16 runs in an angled S-shape such that the area of the first fan 12 (the first opening 14a) is open toward the ventilation side 1a and the area of the second fan 13 (the second opening 14b) is closed toward the ventilation side 1a. Given the diagonal placement of the first separation wall 16a, the area of the first fan 12 expands toward the front edge (ventilation side 1a, see FIG. 3A). As shown in FIGS. 3A, 3D, 3E, and 3F, the first cover plate 17 is provided only in the area of the first fan 12, i.e., only on the first separation wall 16a, the back wall 16b, and the subsequent side wall 16c, while the area of the second fan 13, i.e., the area of the front wall 16d and the subsequent other side wall 16e, is open toward the top.

The course of the second crosspiece 18 can best be seen in FIG. 3C, which shows the ventilation device 1 in a horizontal cross-section under the circuit board 2 (the air stream boundary plane L, FIG. 1). The second crosspiece 18 has a separation wall 18a that runs diagonally between the openings 14b, 14a over the cover plate 14 and thereby separates an area around the second fan 13 from an area around the first fan 12 above the cover plate 14. In the area of the second fan 13 (the second opening 14b) a side wall 18c adjoins the separation wall 18a at a back edge of the cover plate 14, running along a back wall 18b and then bending toward the front at right angles as it continues. In the area of the first fan 12 (the first opening 14a) another side wall 18e adjoins the separation wall 18a at the front edge (ventilation side 1a, see FIG. 3A) of the cover plate 14, running along a front wall 18d and then bending toward the back at right angles as it continues. In other words, the second crosspiece 18 runs in an angled S-shape that corresponds to the S-shape of the first crosspiece 16 mirrored in the plane IIID in FIG. 3B such that the area of the second fan 13 (the second opening 14b) is open toward the ventilation side 1a and the area of the first fan 12 (the first opening 14a) is closed toward the ventilation side 1a. Given the diagonal placement of the second separation wall 18a, the area of the second fan 13 expands toward the front edge (ventilation side 1a, see FIG. 3A). As shown in FIGS. 1, 3D, 3E, and 3F, the second cover plate 19 is provided only in the area of the second fan 13, i.e., only on the second separation wall 18a, the back wall 18b, and the subsequent side wall 18c, while the area of the first fan 12, i.e., the area of the front wall 18d and the subsequent other side wall 18e, is open toward the top.

As can best be seen in FIG. 3D, the fans 12, 13 are both located on the side of the mounting plate 14 that is open toward the top and therefore not closed off by a cover plate 17 or 19, while the areas closed off by the cover plates 17 or 19 are free of components. These empty areas can be used as flow deflection areas, which are open toward the ventilation side 1a of the ventilation device 1 (see FIGS. 3E, 3F). For purposes of the invention, these flow deflection areas are designated as air guidance chambers, while the areas around the fans 12, 13 are designated as sub-chambers. Therefore, the area open toward the bottom in which the first fan 12 is located defines a first sub-chamber 20, the area open toward the top in which the second fan 13 is located defines a second sub-chamber 21, a first air guidance chamber 22 is formed by the mounting plate 14, the first crosspiece 16 (first separation wall 16a, back wall 16b, side wall 16c), and the first cover plate 17, and a second air guidance chamber 23 is formed by the mounting plate 14, the second crosspiece 18 (second separation wall 18a, back wall 18b, side wall 18c), and the second cover plate 19.

Because the separation walls 16a, 18a intersect diagonally, as viewed from above, the fan-shaped flows of the cooling air streams 5, 7 also intersect as viewed from above. It should be understood that the crosspieces 16, 18 can be one piece or can be made of multiple pieces joined together. As can be seen in FIGS. 3A, 3B, 3D, the mounting plate 14 extends laterally beyond the side walls of the crosspiece 16, 18, which makes it easier to mount the ventilation device. Of course, it is also possible for the mounting plate 14 to be located in other places, for example on the front or back sides, or to use other means of mounting the device.

Figure 4:
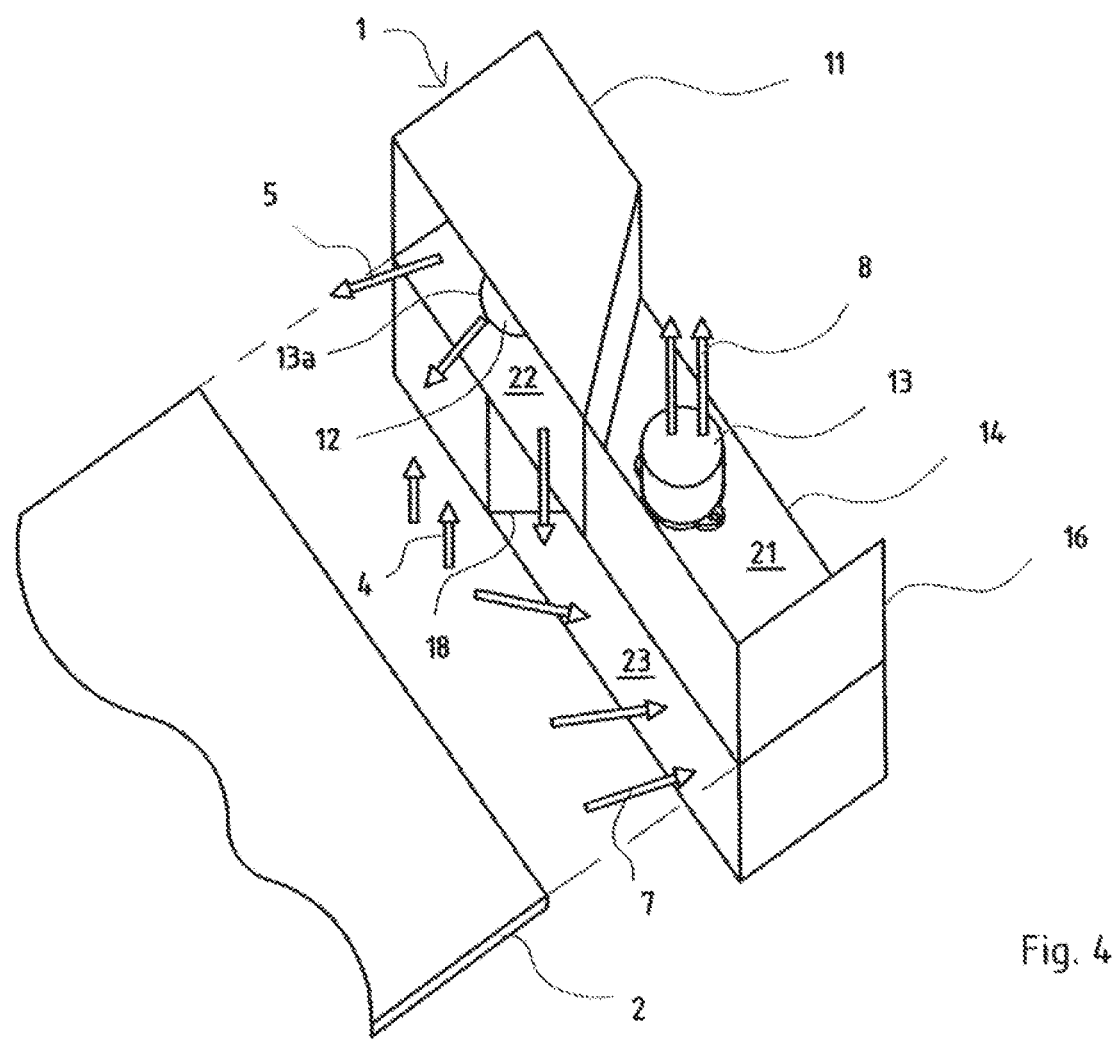
FIG. 4 a three-dimensional representation of the ventilation device according to the first embodiment in the second operating mode.

FIG. 4 shows a three-dimensional representation of this embodiment of the ventilation device 1 with a portion of the circuit board 2. This representation shows the pathways of the air streams 4, 5, 7, 8 in the second operating mode according to FIG. 2.

Figure 5:
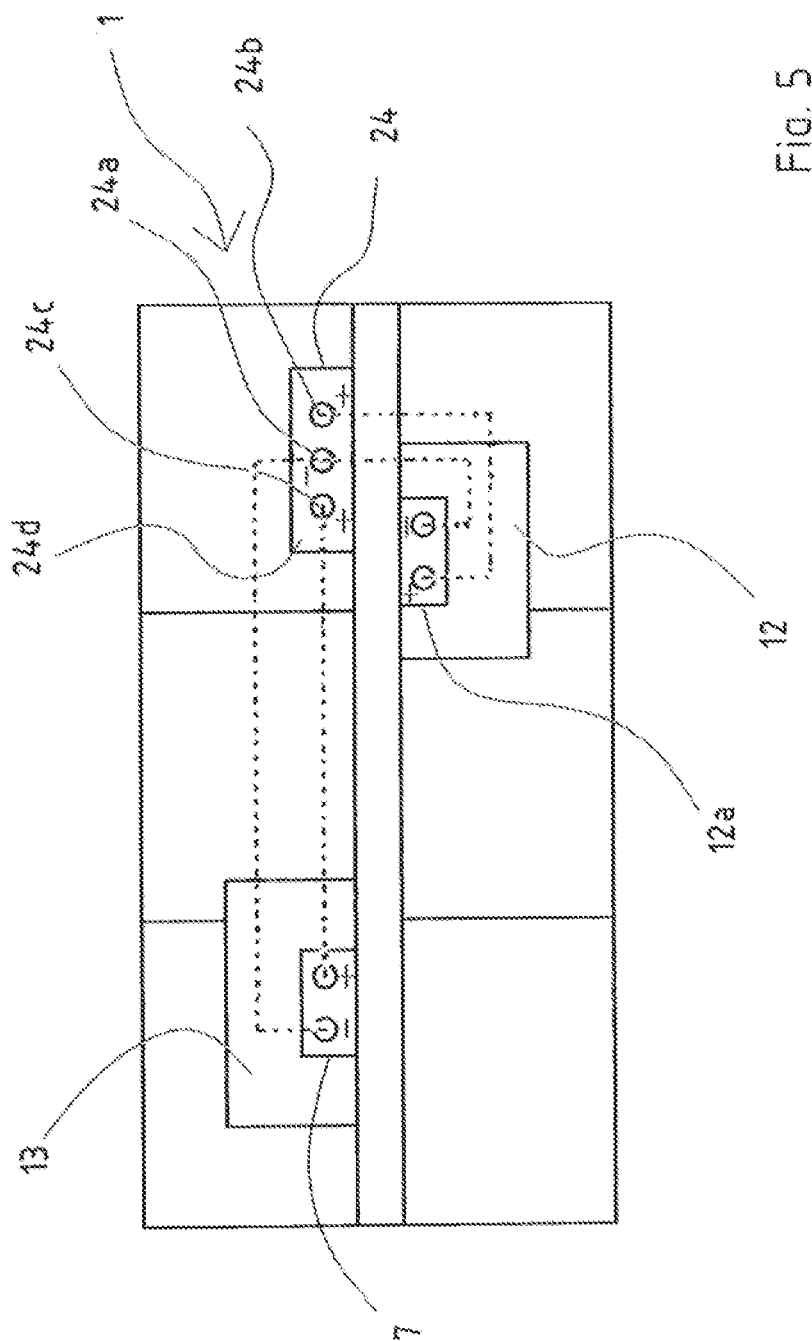
FIG. 5 a representation of the back of a ventilation device from the first embodiment.

FIG. 5 shows a representation of the back of a ventilation device from the first embodiment. As seen in FIG. 5, there is a three-pole symmetrical connection port 24 with a central common ground connector 24a for both fans 12, 13, a first positive pole 24b for supplying power to the first fan 12, and a second positive pole 24c for supplying power to the second fan 13. A first fan connection port 12a for the first fan 12 has a negative pole connected to the common ground connector 24a and a positive pole connected to the first positive pole 24b of the symmetrical connection port 24. A second fan connection port 13a for the second fan 13 has a negative pole connected to the common ground connector 24a and a positive pole connected to the second positive pole 24c of the symmetrical connection port 24. A common positive pole can also be provided instead of a common ground connector 24a. The common connector 24a can be located between the other two connectors 24b, 24c to create an axis- and/or point-symmetrical connection port 24 or an axis- and/or point-symmetrical connecting element, which because of its symmetry can be located on a card/circuit board with reverse-polarity protection. Because the connection port 24 is symmetrical, a connector making (external) contact with the connection port can be plugged into or onto the connection port 24 with reverse-polarity protection. However, a symmetrical power supply is not absolutely necessary. In another embodiment, the power supply as configured as a parallel connection. The fan connections to the power supply can be three-pole (3-pole). In another embodiment of the invention, in addition to the power supply there is also a tach signal for controlling the rpm rate or speed of the fan(s) and thereby the air volume moved by the fan(s) per unit of time on a control unit for the fan(s). By evaluating the tach signal, the rotation speed of the fan(s) can be monitored and adjusted. In addition, it is possible to determine and assess whether there has been a fan failure.

The connection port 24 has a shape characteristic 24d in the form of a bevel on one corner. Because only a matching connector with the corresponding complementary shape characteristic fits into the connection port 24, this ensures reverse-polarity protection of the power supply for the fans 12, 13 with a single connector.

Because the crosspieces 16, 18 (FIGS. 3B, 3C) have no back walls in the area of the sub-chambers 20, 21, the fan connection ports 12a, 13a are easily accessible from the back of the ventilation device 1. To the extent necessary for reasons of stability, the crosspieces can also be extended farther into the area of the sub-chambers 20, 21. If the sub-chambers 20, 21 are completely closed off at the back, the fan connection ports 12a, 13a could still be accessed from above or below.

Figure 6:
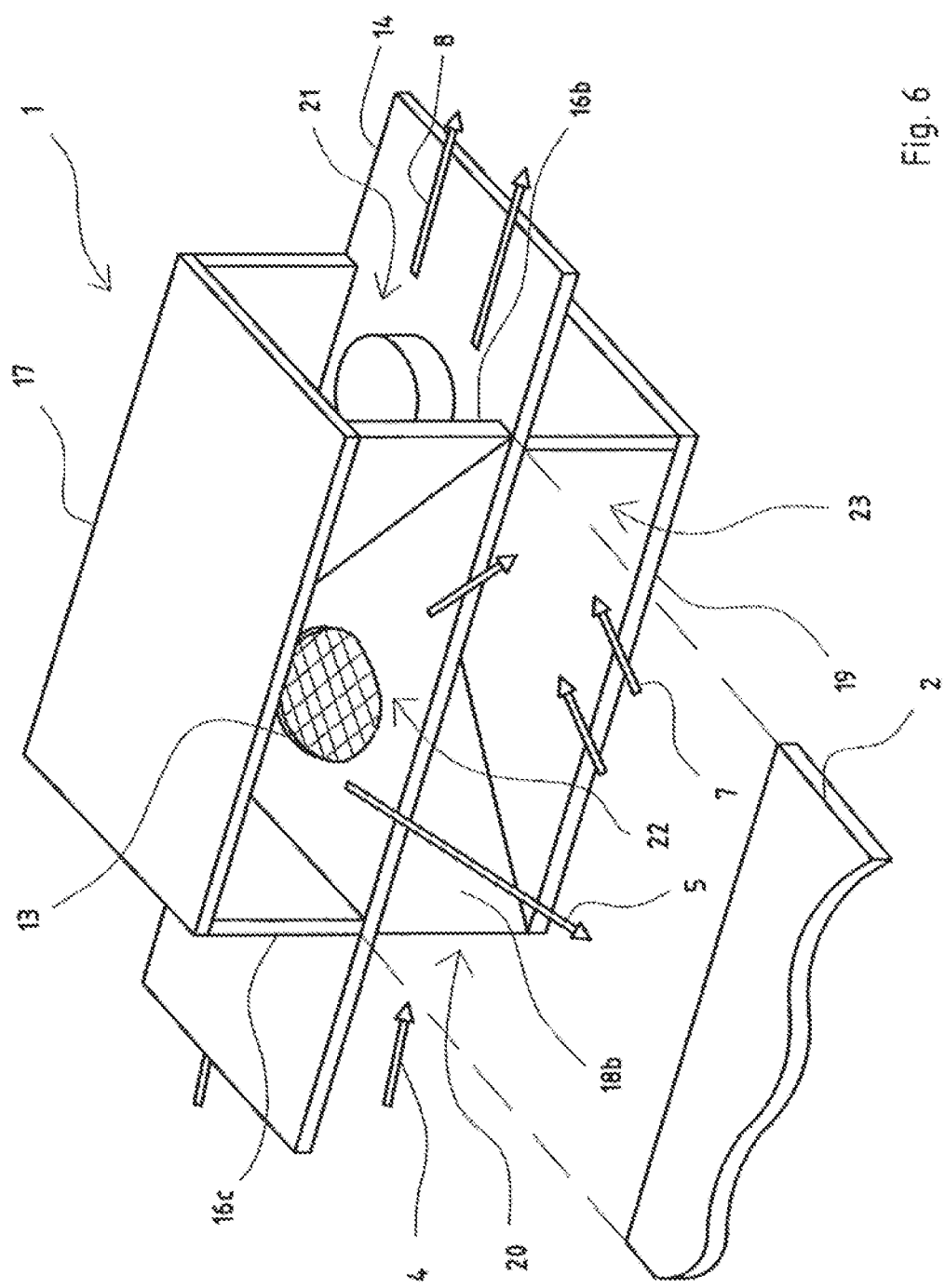
FIG. 6 a representation of the ventilation device according to a second embodiment of the present invention in the second operating mode.

FIG. 6 shows a three-dimensional representation of the ventilation device 1 according to a second embodiment of the present invention in the second operating mode. This embodiment is a variation of the previously described first embodiment. Except where stated otherwise below, the explanations, assemblies, effects, and advantages of the first embodiment and its variations apply equally or similarly to this embodiment.

As shown in FIG. 6, the cover plates 17, 19 extend over the entire surface of the crosspieces 16, 18. However, in the area of the sub-chambers 20, 21 (where the fans are to be located), the side walls 16e, 18a (FIGS. 3B, 3C) of the crosspieces 16, 18 are omitted and the back walls run all the way to the sides, so also through the areas of the sub-chambers 20, 21. In other words, only the sides of the sub-chambers 20, 21 are open to the outside. Fresh air and/or exhaust streams (depending on the operating mode, here fresh air stream 4 and exhaust stream 9) flow in or out through the open sides of the sub-chambers 20, 21 of the ventilation device 1.

This arrangement is useful in cases where free air streams are possible or ventilation slots are available only from or on the side of the ventilation device 1. In this case it is advantageous to insert the fans partially into the openings 14a, 14b, so that bottlenecking in the sub-chambers 20, 21 is prevented.

Figure 7:
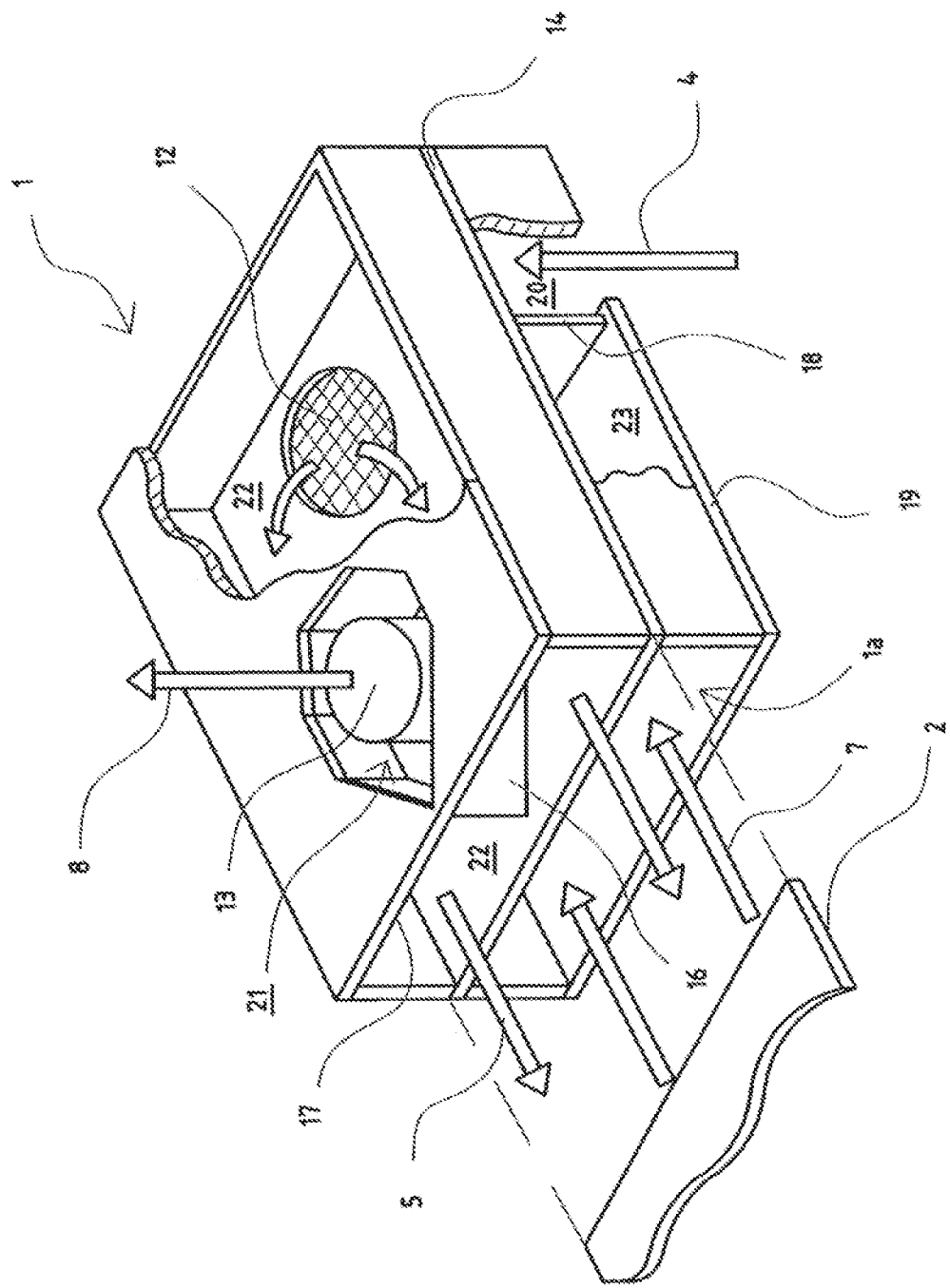
FIG. 7 a representation of the ventilation device according to a third embodiment of the present invention in the second operating mode.
Figure 8A:
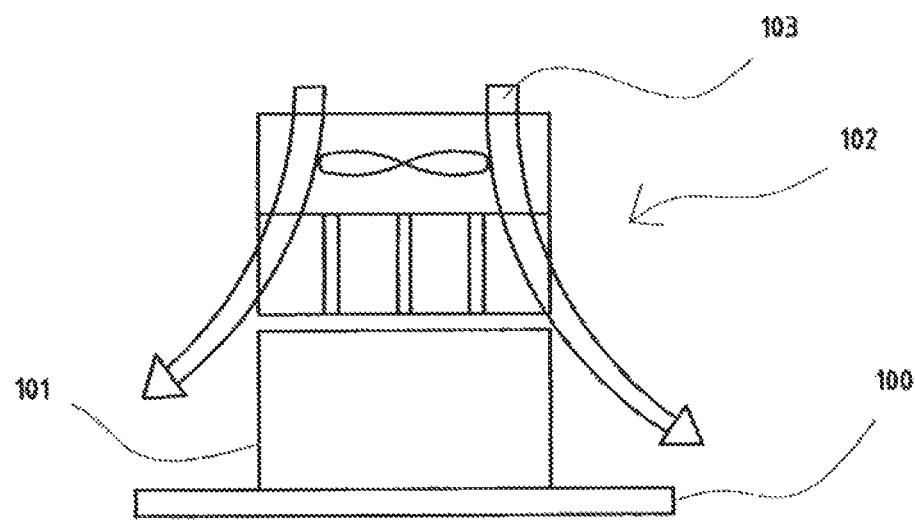
FIGS. 8A and 8B Side views of ventilation devices according to the prior art.
Figure 8B:
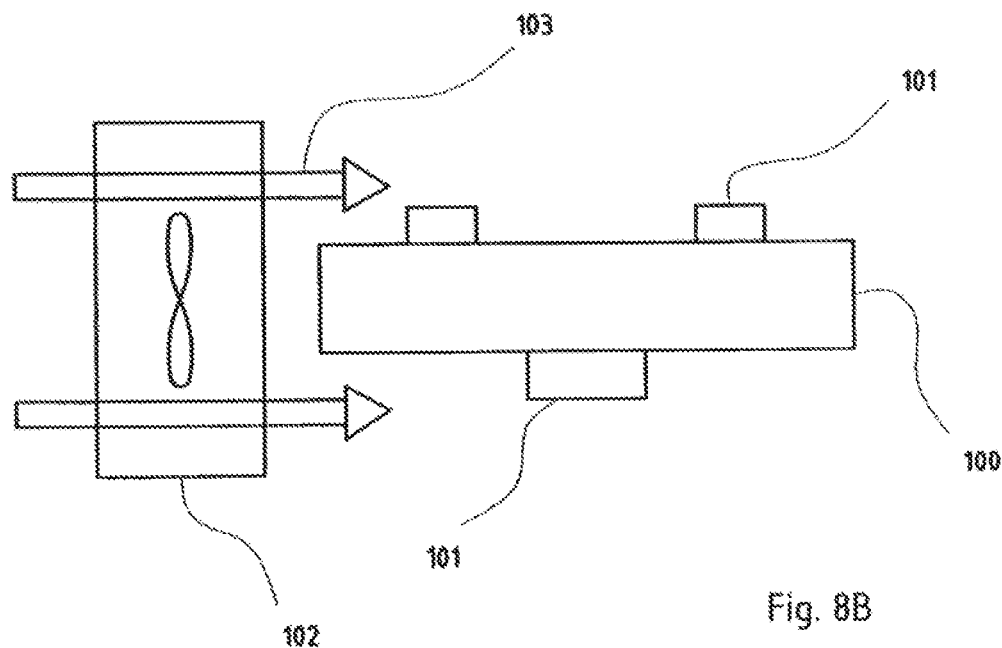

FIG. 7 shows a three-dimensional representation of the ventilation device according to a third embodiment of the present invention in the second operating mode. This embodiment is a variation of the first embodiment. Except where stated otherwise below, the explanations, assemblies, effects, and advantages of the first embodiment and its variations and modifications apply equally or similarly to this embodiment.

As shown in FIG. 7, the fans 12, 13 are located on the mounting plate 14 one behind the other rather than next to each other with respect to the circuit board 2, so that here the second fan 13 is assumed to be closer to the circuit board 2 (ventilation side 1a) than the first fan 12. The first sub-chamber 20 is therefore square-shaped and located in the lower rear area, and the first air guidance chamber 22, also square-shaped, extends over the entire length of the ventilation device 1. The first crosspiece 16 consists of multiple parts and has a first part that encloses the first air guidance chamber 22 on the side and back, and a second closed circular part located inside the first air guidance chamber 22, creating the second sub-chamber 21 as an inset within the first air guidance chamber 22, so that the first cooling air stream 5 flows around it from the side. Here the circular shape of the second part of the first crosspiece 16 that forms the second sub-chamber 21 is streamlined to be more symmetrically drop-like in shape. The second air guidance chamber 23, which is again square-shaped, ends before the area of the first fan, so before the first sub-chamber 20.

This arrangement is useful in cases where a circuit board 2 needs to be ventilated from a narrow side. The fans can have varying power levels or different flow resistances as needed.

The invention has been described based on preferred embodiments, variations, alternatives, and modifications and illustrated in the figures. These descriptions and representations are purely schematic and do not limit the protective scope of the claims, but rather are intended only as illustrative examples. It should be understood that the invention, in the scope and to the extent described in the patent claims, can be executed and modified in many ways without leaving the protective scope of the patent claims.

For example, the invented ventilation device 1 can also be configured such that there are radial fans inside the air guidance chamber, with internal axial-radial or radial-axial flow deflection, whose radial in- or outflow is split or combined appropriately by the air guidance chambers, so that the axial in- or outflow passes through the openings 14a, 14b.

The features of the invention described in relation to the illustrated embodiments, e.g., the common connection port 24a according to FIG. 5, can also be part of other embodiments of the invention, e.g., in the ventilation arrangement according to FIG. 6 and/or FIG. 7, except when stated otherwise or when impossible for technical reasons.

LIST OF REFERENCE SIGNS AND SYMBOLS

1 Ventilation device
1a Ventilation side
2 Circuit board
2a First circuit board flat side (top side)
2b Second circuit board flat side (bottom side)
3 Component(s)
4 Fresh air stream
5 First cooling air stream
6 Fresh air stream
7 Second cooling air stream
8 Exhaust stream
9 Wall
10 Deflected flow
11 Housing
12 First fan
12a Fan connection port
13 Second fan
13a Fan connection port
14 Mounting plate
14a First opening
14b Second opening
15 Screws
16 First crosspiece
16a First separation wall
16b Back wall
16c Side wall
16d Front wall
16e Side wall
17 First cover plate
18 Second crosspiece
18a Second separation wall
18b Back wall
18c Side wall
18d Front wall
18e Side wall
19 Second cover plate
20 First sub-chamber
21 Second sub-chamber
22 First air guidance chamber
23 Second air guidance chamber
24 Symmetrical connection port
24a Ground connector
24b First positive pole
24c Second positive pole
24d Form characteristic
100 Circuit board (prior art)
101 Component
102 Fan unit
103 Air stream
BL Ventilation plane
L Air stream boundary plane/Circuit board plane The above list is an integral part of the description.

What is claimed is:

1. A ventilation device, comprising:
a first fan configured to produce a first cooling air stream having a first direction of flow;
a second fan configured to produce a second cooling air stream having a second direction of flow, the second direction of flow being opposite the first direction of flow, wherein the first cooling air stream flows along a first side of a circuit board and the second cooling air stream flows along a second side of the circuit board that is opposite the first side of the circuit board; and a housing, the housing having a mounting plate positionable adjacent the circuit board, the first fan attached to a first side of the mounting plate within a first air guidance chamber at least partially defined by one or more walls connected to the mounting plate and the second fan attached to a second side of the mounting plate within a second air guidance chamber at least partially defined by one or more walls connected to the mounting plate, the second air guidance chamber being separated from the first air guidance chamber so that that first cooling air stream flows around a sub-chamber of the second air guidance chamber in which the second fan is positioned as the first cooling air stream flows toward the circuit board in the first direction of flow.

2. The ventilation device of claim 1, wherein the first cooling air stream is a suction stream and the second cooling air stream is a discharge stream.

3. The ventilation device of claim 1, wherein the first cooling air stream is a discharge stream from the first fan and the second cooling air stream is a suction stream.

4. The ventilation device of claim 1, wherein the first side of the mounting plate is a top side and the second side of the mounting plate is an underside of the mounting plate.

5. The ventilation device of claim 1, wherein one of the walls that at least partially defines the first air guidance chamber is a separation wall that extends perpendicular to the mounting plate and at an angle to a ventilation side and one of the walls that at least partially defines the second air guidance chamber is a separation wall that extends perpendicular to the mounting plate and at an angle to the ventilation side.

6. The ventilation device of claim 1, wherein the mounting plate is a segment of the circuit board.

7. The ventilation device of claim 6, wherein the housing contains a material selected from the group consisting of plastic, circuit board material, aluminum, steel, cardboard, paper and pasteboard.

8. The ventilation device of claim 1, further comprising a symmetrical connection port configured to accommodate an electric power supply to the first fan and the second fan, wherein the connection port has a common negative pole for grounding and respective positive poles for supplying power to each of the first fan and the second fan arranged symmetrically around the negative pole.

9. A method for ventilating a circuit board comprising:
providing a housing, the housing having a mounting plate positionable adjacent the circuit board, a first fan attached to a first side of the mounting plate within a first air guidance chamber at least partially defined by one or more walls connected to the mounting plate and a second fan attached to a second side of the mounting plate within a second air guidance chamber at least partially defined by one or more walls connected to the mounting plate, the second air guidance chamber being separated from the first air guidance chamber;
producing a first cooling air stream having a first direction of flow via the first fan so that that a first cooling air stream passes around a sub-chamber of the second air guidance chamber in which the second fan is positioned as the first cooling air stream flows toward the circuit board in the first direction of flow; and
producing a second cooling air stream having a second direction of flow that is opposite the first direction of flow, wherein the first cooling air stream flows along a first side of the circuit board and the second cooling air stream flows along on a second side of the circuit board that is opposite the first side of the circuit board.

10. The method of claim 9, wherein the first cooling air stream is a suction stream and the second cooling air stream is a discharge stream.

11. The method of claim 9, wherein the first cooling air stream is a discharge stream from the first fan and the second cooling air stream is a suction stream from the second fan.

12. The method of claim 9, wherein the first air guidance chamber is open toward a ventilation side and the second air guidance chamber is open toward the ventilation side.

13. The method of claim 9, wherein the first side of the mounting plate is a top side of the mounting plate and the second side of the mounting plate is an underside of the mounting plate.

14. The method of claim 13, wherein one of the walls that at least partially defines the first air guidance chamber is a separation wall that extends perpendicular to the mounting plate and at an angle to the ventilation side and one of the walls that at least partially defines the second air guidance chamber is a separation wall that extends perpendicular to the mounting plate and at an angle to the ventilation side.

15. The method of claim 9, wherein the mounting plate is a segment of the circuit board.

16. The method of claim 15, wherein the housing contains a material selected from the group consisting of plastic, circuit board material, aluminum, steel, cardboard, paper and pasteboard.

17. The method of claim 9, comprising:
providing an electric power supply to the first fan and the second fan via a symmetrical connection port, the connection port having a common negative pole for grounding and respective positive poles for supplying power to each of the first fan and the second fan arranged symmetrically around the negative pole.

18. The method of claim 17, wherein the mounting plate is a segment of the circuit board.

19. A ventilation device designed to ventilate a circuit board, comprising:
a first fan configured to produce a first cooling air stream having a first direction of flow; and
a second fan configured to produce a second cooling air stream having a second direction of flow, the second direction of flow being opposite the first direction of flow, wherein the first cooling air stream flows along a first side of the circuit board and the second cooling air stream flows along a second side of the circuit board that is opposite the first side of the circuit board;
a housing, the housing having a mounting plate positionable adjacent the circuit board, the first fan attached to a first side of the mounting plate within a first air guidance chamber at least partially defined by one or more walls connected to the mounting plate and the second fan attached to a second side of the mounting plate within a second air guidance chamber at least partially defined by one or more walls connected to the mounting plate, the second air guidance chamber being separated from the first air guidance chamber so that that first cooling air stream flows around a sub-chamber of the second air guidance chamber in which the second fan is positioned as the first cooling air stream flows toward the circuit board in the first direction of flow;

wherein the housing has a ventilation side that defines a ventilation plane, wherein the housing is at least partially open on its ventilation side;

wherein the first cooling air stream is directable through a first opening in the mounting plate and the second cooling air stream is directable through a second opening in the mounting plate; and wherein the first air guidance chamber is open toward the ventilation side and the second air guidance chamber is open toward the ventilation side.

20. The ventilation device of claim 19, wherein the mounting plate is a segment of a circuit board.

* * * * *